United States Patent [19]

Chi et al.

[11] Patent Number: 5,776,795

[45] Date of Patent: Jul. 7, 1998

[54] METHOD OF MAKING A CONTACTLESS CAPACITOR-COUPLED BIPOLAR ACTIVE PIXEL SENSOR WITH INTERGRATED ELECTRONIC SHUTTER

[75] Inventors: Min-Hwa Chi; Albert Bergemont, both of Palo Alto; Carver Mead, Pasedena, all of Calif.

[73] Assignee: Foveonics, Inc., Cupertino, Calif.

[21] Appl. No.: 923,757

[22] Filed: Sep. 2, 1997

Related U.S. Application Data

[62] Division of Ser. No. 696,065, Aug. 13, 1996, Pat. No. 5,734,191.

[51] Int. Cl.⁶ ............................................ H01L 21/00
[52] U.S. Cl. ............................................ 438/66; 438/79
[58] Field of Search ............................ 438/66, 78, 79; 257/291

[56] References Cited

U.S. PATENT DOCUMENTS 5,260,592  11/1993  Mead et al. ............................ 257/291
5,289,023   2/1994  Mead ..................................... 257/291

FOREIGN PATENT DOCUMENTS 63-131570 A  6/1988  Japan ............................ H01L 27/14
63-144562 A  6/1988  Japan ............................ H01L 27/14

Primary Examiner—Brian Dutton
Attorney, Agent, or Firm—Limbach & Limbach L.L.P.

[57] ABSTRACT

A contactless capacitor coupled bipolar phototransistor having an integrated electronic shutter for reducing the overflow and blooming problems associated with the imaging of strong images. Overflow control and an anti-blooming mechanism are obtained by use of a second emitter (the "shutter") which is used to remove excess image generated charge. This prevents the base-emitter junction potential from becoming forward biased during image integration when the phototransistor is exposed to a strong image. The shutter is biased slightly lower than the first emitter of the phototransistor so that the base-shutter junction is forward biased sooner than the base-emitter junction when the imaging element is exposed to a strong image. The overflow current of the generated holes is then drained to the shutter, rather than into the emitter where it would produce noise on the column sense line.

4 Claims, 5 Drawing Sheets

METHOD OF MAKING A CONTACTLESS CAPACITOR-COUPLED BIPOLAR ACTIVE PIXEL SENSOR WITH INTERGRATED ELECTRONIC SHUTTER

This is a divisional of application Ser. No. 08/696,065, filed Aug. 13, 1996, now U.S. Pat. No. 5,734,191.

TECHNICAL FIELD

The present invention relates to phototransistors used as sensors in imaging arrays, and more specifically, to a contactless active pixel sensor having an electronic shutter for purposes of reducing noise due to overflow and blooming effects.

BACKGROUND OF THE INVENTION

Bipolar transistors are currently used as sensor elements of imaging arrays. Each transistor can be used both as an integrating photosensor and as a select device. The phototransistor sensor produces an output (photo)current as a result of absorbing photons, with the output current being proportional to the intensity of light incident on the sensor. Photons absorbed in the area of a phototransistor collector-base or emitter-base junction produce electron-hole pairs that are collected by a nearby p-n junction. Minority carriers collected by either junction act as a base current and are multiplied by the transistor gain to produce the collector current. The emitter current is the sum of the base current and collector-current, and is usually used as the output of the sensor.

FIG. 1 is a cross-sectional view showing the structure of a prior art contactless bipolar phototransistor 10 which can be used as a sensing element in an imaging array. Phototransistor 10 is fabricated in n-well 12 which is formed in a semiconductor substrate (not shown) using a standard n-well BiCMOS fabrication process, to which is added p-type base region diffusion and emitter definition steps. N-well 12 serves as a common collector for the phototransistors in the photosensor array and is biased at voltage $V_{cc}$. P-type base region 14 of phototransistor 10 is formed by implanting the appropriate dopant species into n-well 12 through openings in field oxide layer (FOX) 16. Polysilicon-1 layer 18 is grown over the surface of phototransistor 10. Polysilicon layer 18 is doped with an n-type species such as Arsenic using conventional semiconductor processing methods. In the areas where polysilicon layer 18 is in contact with the surface of p-type base region 14, it forms an n+ epitaxial region 20 which serves as the emitter for phototransistor 10. It is desirable to subject the phototransistor structure to a high-temperature step to diffuse the n-type dopant into p-type base region 14 to form the actual emitter junction. Polysilicon region 18 is patterned to form a column sense line region which contacts the p-type base regions (and forms the emitters) of other phototransistors in the same column of the imaging array.

After the patterning of polysilicon region 18, an interpoly gate oxide layer 22 is formed over the surface of polysilicon layer 18. Gate oxide layer 22 acts as the dielectric for a capacitor which couples base region 14 of phototransistor 10 to n+ polysilicon-2 layer 24 which is formed over oxide layer 22. The plates of the capacitor are p-type base region 14 and polysilicon-2 layer 24. In an array of such sensing elements, the base terminals of all the phototransistors in a row are capacitively coupled to a common row select line formed by polysilicon-2 layer 24. Emitter 20 serves as the output node for the integrating photosensor of FIG. 1, with the output nodes of all of the sensors in a column being connected to a common column sense line formed from polysilicon-1 layer 18. It is noted that FIG. 1 shows the structure of an npn type phototransistor and that a corresponding pnp type phototransistor may be formed by interchanging the n-type and p-type regions and reversing the polarities of the associated voltages.

As noted, phototransistor 10 is fabricated by modifying a standard BiCMOS process to include the step of forming p-type base region 14. This step is performed after field oxide formation and nitride strip, or a similar step in the standard process. Following the formation of the base region, the emitter region is defined and polysilicon layer 18 is doped with an n-type implant to form emitter 20. Gate oxide layer 22 and row select line 24 are formed during the processing steps which are used to form the gate oxide and polysilicon gates of the MOS devices.

During the operation of phototransistor 10, row select line 24 is held at a fixed voltage which is chosen to reverse bias the base-emitter junction of phototransistor 10. As image photons impact the phototransistor, electrons and holes are generated. The photo-generated electrons are swept into n-well 12 and removed through the collector voltage line ($V_{cc}$) The photo-generated holes accumulate in p-type base region 14 and produce an increase in the base potential. The photocurrent generated integrates on the capacitor which is formed as part of the structure of phototransistor 10 of FIG. 1. This corresponds to an image storage operation. When it is desired to read out the stored image contained in the imaging element represented by phototransistor 10, row select line 24 is brought to a high value, thereby forward biasing the base-emitter junction of the transistor. In this situation, the integrated photocurrent, multiplied by the current gain of phototransistor 10 flows from emitter region 20 to column sense line 18. An integrating sense amplifier connected to column sense line 18 is used to sense the current produced by each of the sensor elements contained in the column.

The phototransistor shown in FIG. 1 has several advantages over other types of imaging elements: 1) the structure may be implemented in a smaller size than corresponding CCD and CMOS compatible elements; and 2) the fabrication process is compatible with double-poly CMOS process flows, having one additional mask for the base implant and a second additional mask for the emitter definition. The polysilicon-2 layer (row select line region) to base capacitor dielectric is the gate oxide layer, and the emitter region is self-aligned by the n+ implant.

However, the phototransistor of FIG. 1 does have disadvantages. When a strong image (intense light) is incident on the imaging element formed from the transistor, the base potential during the integration process increases rapidly due to the photo-generated holes until the base-emitter junction is slightly forward biased. Further holes which are generated in the base region are injected into the emitter. This is termed the "overflow" problem, and it contributes to the column sense line signal as noise when other elements in the same column of the array are being sensed (the image is being read). This produces a vertical noise pattern on a bright image spot.

A second disadvantage is that those imaging elements exposed to a strong image are difficult to reset back to the same reverse bias level for purposes of image storage (photo-generated charge integration). The residue charge requires a relatively long time period (approximately 100 ms) to be recombined into the base of the phototransistor.

This produces an image lag or "blooming" effect in which a bright tail is associated with a moving bright image spot.

Both the overflow and blooming problems noted contribute to a degradation of the image quality in the cases of strong images. This reduces the utility of such photosensors for obtaining images in situations of bright (intense) light.

What is desired is a design for a contactless bipolar active pixel element which does not suffer from the overflow and blooming problems described.

SUMMARY OF THE INVENTION

The present invention is directed to a contactless capacitor coupled bipolar phototransistor having an integrated electronic shutter for reducing the overflow and blooming problems associated with the imaging of strong images. Overflow control and an anti-blooming mechanism are obtained by use of a second emitter (the "shutter") which is used to remove excess image generated charge. This prevents the base-emitter junction potential from becoming forward biased during image integration when the phototransistor is exposed to a strong image.

The shutter is biased slightly lower than the first emitter of the phototransistor so that the base-shutter junction is forward biased sooner than the base-emitter junction when the imaging element is exposed to a strong image. The overflow current of the generated holes is then drained to the shutter, rather than into the emitter where it would produce noise on the column sense line.

Further objects and advantages of the present invention will become-apparent from the following detailed description and accompanying drawings.

DETAILED DESCRIPTION OF THE INVENTION

Figure 2:
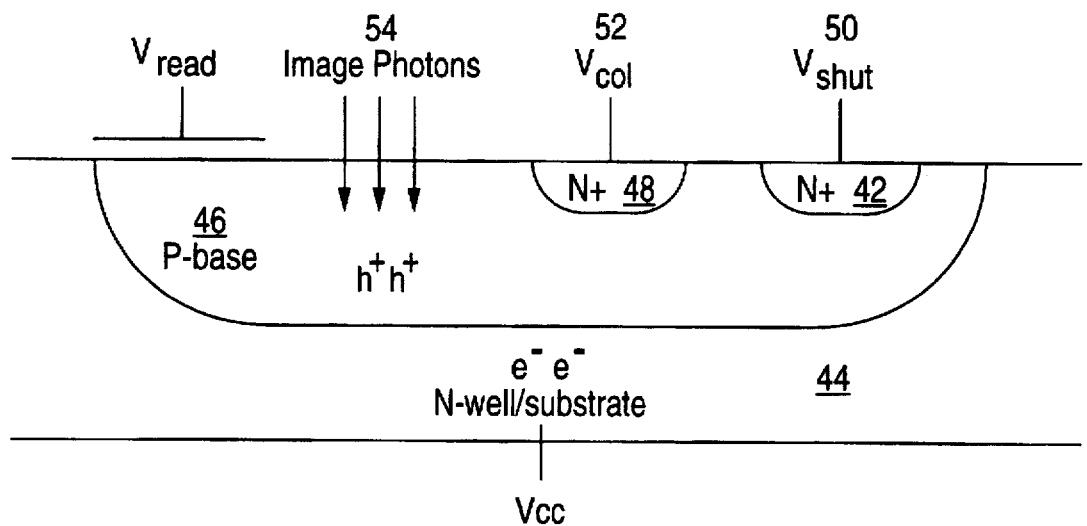
FIG. 2 is a diagram showing the cross-section of a phototransistor imaging element of the present invention which incorporates an integrated electronic shutter.

FIG. 2 is a diagram showing the cross-section of a phototransistor imaging element 40 of the present invention which incorporates an integrated electronic shutter 42. As shown in the figure, phototransistor 40 is fabricated in n-well which is formed in a semiconductor substrate, where both structures are indicated as element 44 in the figure. N-well 44 serves as a common collector for the phototransistors in the photosensor array and is biased at a voltage $V_{cc}$. P-type base region 46 of phototransistor 40 is formed by implanting the appropriate species into n-well region 44.

N+ region 48 formed in p-type base region 46 acts as the first emitter of phototransistor 40. However, as noted, a second emitter 42 which serves as the electronic shutter is formed by implanting an n-type dopant into p-type base region 46. During the operation of phototransistor 40, shutter 42 is biased slightly lower (approximately 0.5 volts) than emitter 48, where the biasing voltage(s) are indicated by $V_{shut}$ 50 and $V_{col}$ 52, respectively. Thus, in the case of exposure of phototransistor 40 to a strong image, as represented by image photons 54, the base-shutter junction is forward biased earlier than the base-emitter junction. This causes the overflow current holes (shown as h+ in the figure) to be drained to shutter 42 instead of to emitter 48. This reduces the contribution of the overflow holes to the column noise. This also reduces the blooming effect associated with the existence of the unrecombined "excess" electrons (shown as e− in the figure).

Figure 3:
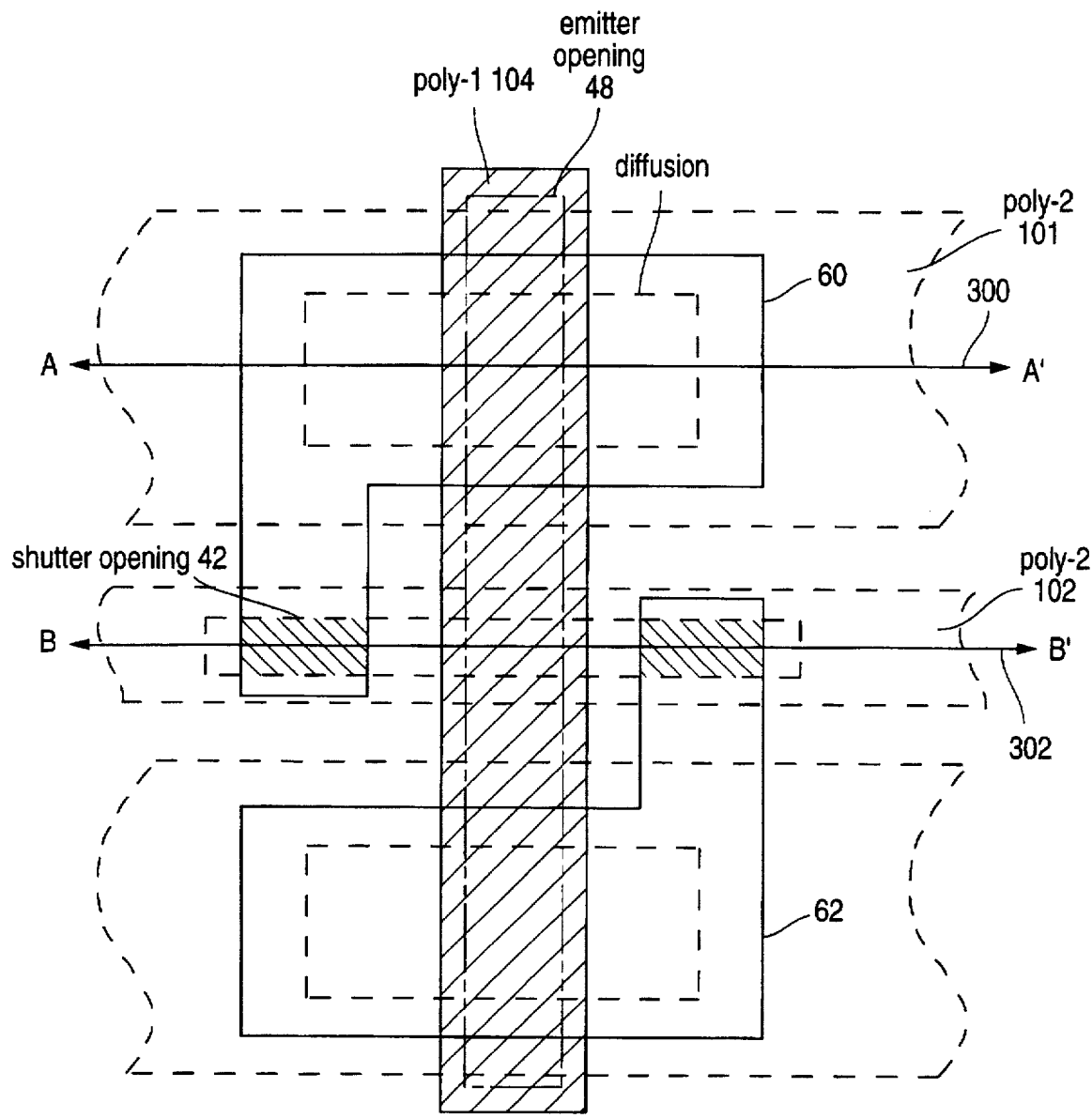
FIG. 3 is a top view of the layout for the phototransistor imaging element of the present invention.

FIG. 3 is a top view of the layout 100 for the phototransistor imaging element of the present invention. FIG. 3 shows the layout for two of the phototransistors, identified as elements 60 and 62 in the figure. As shown in the figure, the n+ junction of shutter 42 is formed from polysilicon-2 layer 102. The control lines for shutter 42 and the capacitor which couples the base of each phototransistor to a row select line formed from polysilicon layer 101 are formed at the same time using a common fabrication step. Emitter region 48 of phototransistor 40 is formed as a result of the deposition of polysilicon-1 layer 104, which also serves as the column sensing line and connects the emitters of the phototransistors in the same column of the array. The layout for the imaging element of the present invention is larger than that for the imaging element of FIG. 1 by the increased size of the shutter polysilicon-2 layer pitch in the y direction (vertical in the figure). Note that the cross-sectional view of the phototransistor(s) of FIG. 3 along the line AA' is the same as that for the phototransistor of FIG. 1.

Figure 1:
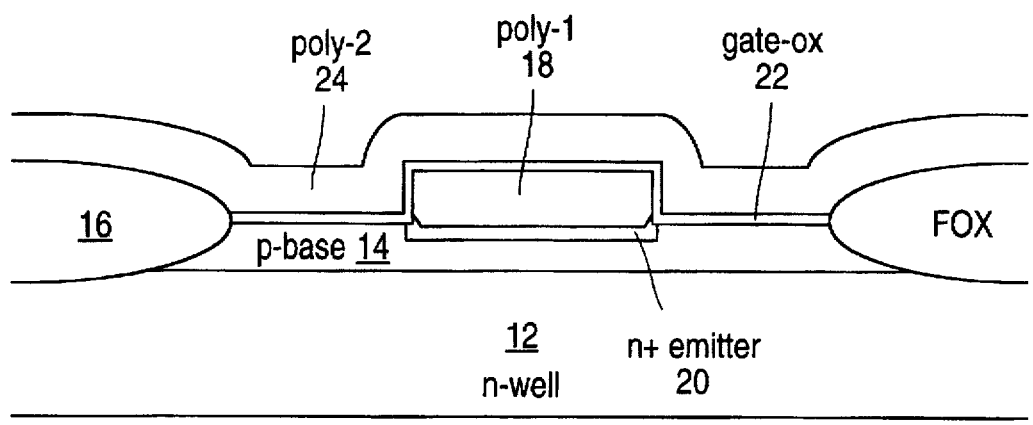
FIG. 1 is a cross-sectional view showing the structure of a prior art contactless bipolar phototransistor which can be used as an element of an imaging array.
Figure 4:
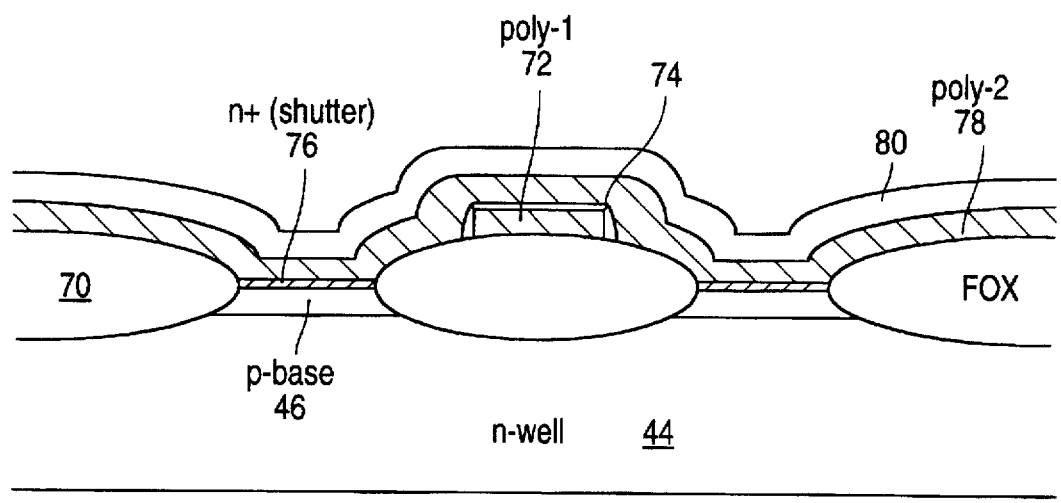
FIG. 4 is a cross-sectional view showing how the structure of the phototransistor imaging element of the present invention differs from the phototransistor of FIG. 1.

FIG. 4 is a cross-sectional view taken along the line BB' of FIG. 3, showing how the structure of the phototransistor imaging element of the present invention differs from the phototransistor of FIG. 1. Referring to FIG. 3, it can be seen that FIG. 4 shows the second emitter or shutter for two phototransistors. Each phototransistor is formed in n-well region 44 which is formed by an appropriate n-type implant into a p-type substrate (not shown). N-well 44 serves as a common collector for the phototransistors in the photosensor array. Standard BiCMOS process steps are then used to define the active regions for the device and remove the nitride layer and form field oxide layer 70. P-type base region 46 of each phototransistor is formed by implanting the appropriate p-type dopant species into n-well 44 through openings in field oxide layer (FOX) 70. Polysilicon-1 layer 72 is grown over the surface of the phototransistors. Polysilicon layer 72 is doped with an n-type species such as Arsenic using conventional semiconductor processing methods. As noted, in the areas where polysilicon layer 72 is in contact with the surface of p-type base region 46, it forms an n+ epitaxial region which serves as the emitter for the phototransistors. Polysilicon region 72 is then patterned to form a column sense line region which contacts the p-type base regions (and forms the emitters) of other phototransistors in the same column of the imaging array.

After the patterning of polysilicon region 72 to form a column sense line, an interpoly gate oxide layer 74 is formed over the surface of polysilicon layer 72. The region for the second emitter or shutter 76 of each phototransistor is then defined and opened. An n-type implant into p-type base region 46 is then performed in the defined region(s). This is followed by growth of polysilicon-2 layer 78 over the surface of the phototransistors. Polysilicon-2 layer 78 forms the shutter control line for shutter 76. Oxide layer 80 is deposited over shutter control line region 76. Gate oxide layer 74 acts as the dielectric for a capacitor which couples base region 46 of the phototransistors to a row select line, where the plates of the capacitor are p-type base region 46 and the row select line.

Figure 5:
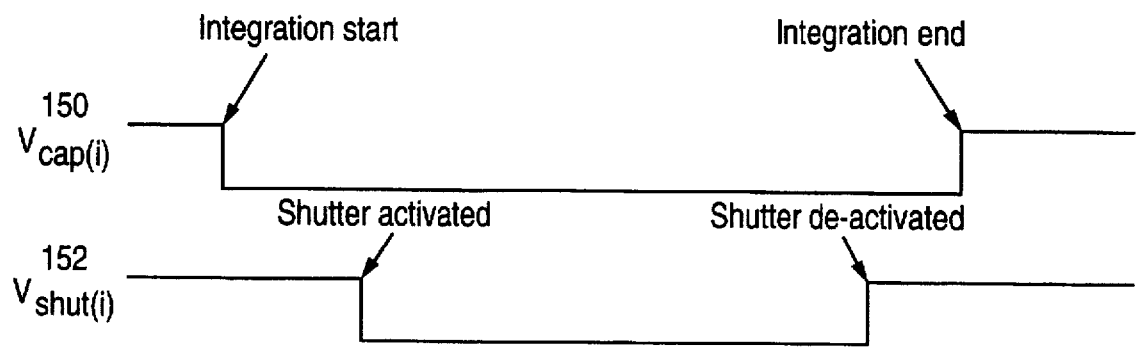
FIG. 5 is a timing diagram showing the relationship between the integration period of the phototransistor and the operation of the electronic shutter of the imaging element of FIG. 2.

FIG. 5 is a timing diagram showing the relationship between the integration period of the phototransistor (as indicated by the voltage on select line 150) and the operation of the electronic shutter (as indicated by the voltage on shutter control line 152) of the imaging element of FIG. 2. In the operation of the phototransistor, the shutter junction is biased at a potential approximately 0.1 to 0.5 volts below that of the n+ emitter (noted as "shutter activated" in the figure) shortly after the phototransistor enters into an integration period (noted as "integration start" in the figure). The shutter is switched back to the same (or a slightly higher) potential as the emitter (noted as "shutter de-activated" in the figure) shortly before the end of the integration period (noted as "integration end" in the figure).

The shutter can be activated by applying a variable voltage level below that of the emitter potential for an adjustable time interval within the integration period as a means of varying the degree of overflow control provided by the shutter. Thus, both the shutter biasing potential and the time period over which the shutter is activated can be varied as desired. The shutter may even be turned off completely if no overflow control is needed, as in the case of dark images.

Figure 6:
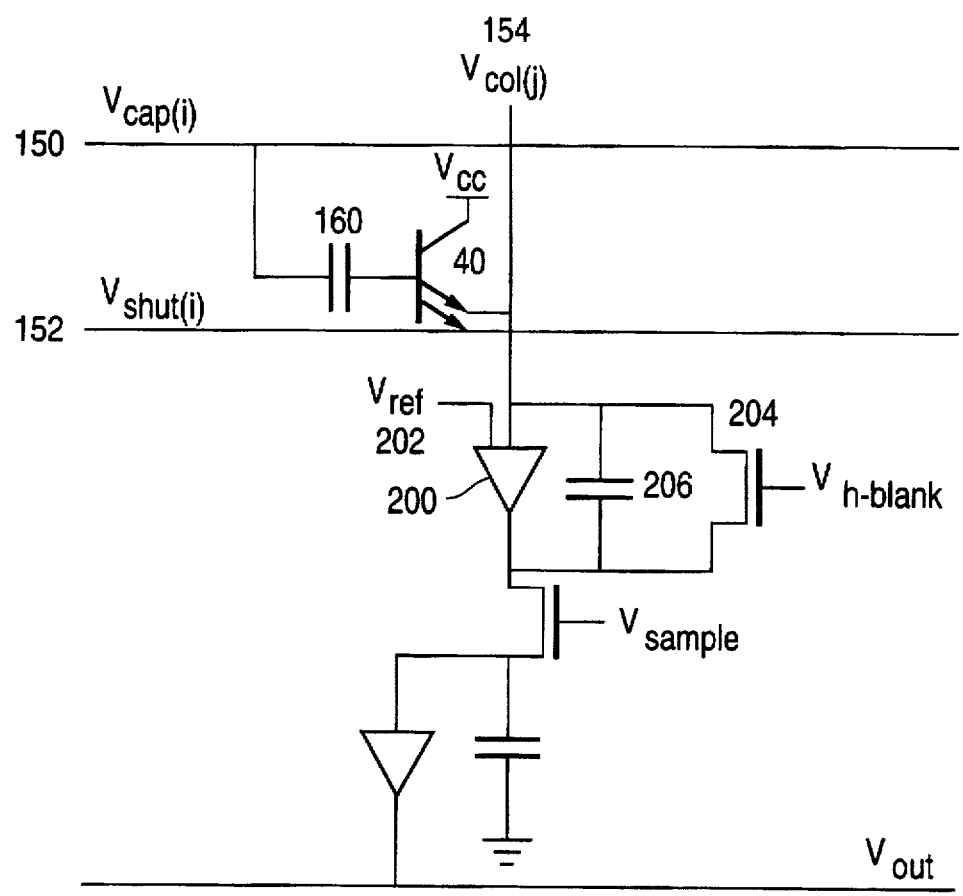
FIG. 6 is a schematic showing the connections between a phototransistor of the present invention which incorporates an electronic shutter and a column sensing circuit used to determine the output of the phototransistor.

FIG. 6 is a schematic showing the connections between a phototransistor 40 of the present invention, which incorporates an electronic shutter, and a column sensing circuit used to determine the output of the phototransistor. The figure shows a single phototransistor or imaging element located at the jth column and ith row of an imaging array containing multiple such phototransistors. Row select line 150 is connected to capacitor 160 which couples the row select line to the base of phototransistor 40, and is used to select the row of the imaging array in which the phototransistor to be read (or sensed) is located. Shutter control line 152 connects to the second emitter of phototransistor 40 which serves as the shutter for the device. It is noted that each row may have its own shutter control line 152, or two rows-of the array may share a common shutter control line. The emitter junction of phototransistor 40 is connected to column sense line 154, which acts to connect the emitters of each phototransistor in a column of the array.

The column sensing circuit includes a sense amplifier formed from an amplifying element 200 having its non-inverting input connected to reference voltage 202 ("$V_{ref}$" in the figure) and its inverting input connected to column control line 154. P-channel balance transistor 204 and capacitor 206 are connected between the inverting input and output of amplifying element 202. The gate of balance transistor 204 is connected to a balance control line (noted as "$V_{h-blank}$" in the figure) which is used to calibrate amplifying element 200 prior to conducting a read operation. The emitter (output) current produced on column control line 154 is sensed and integrated by charge amplifying element 200 and capacitor 206. The output of element 200 is subjected to a sample and hold using transistor 208, which is controlled by sample control line 210 (indicated as "$V_{sample}$" in the figure). The output of transistor 208 is provided to amplifying element 212, which makes the signal available on output line 214.

Figure 7:
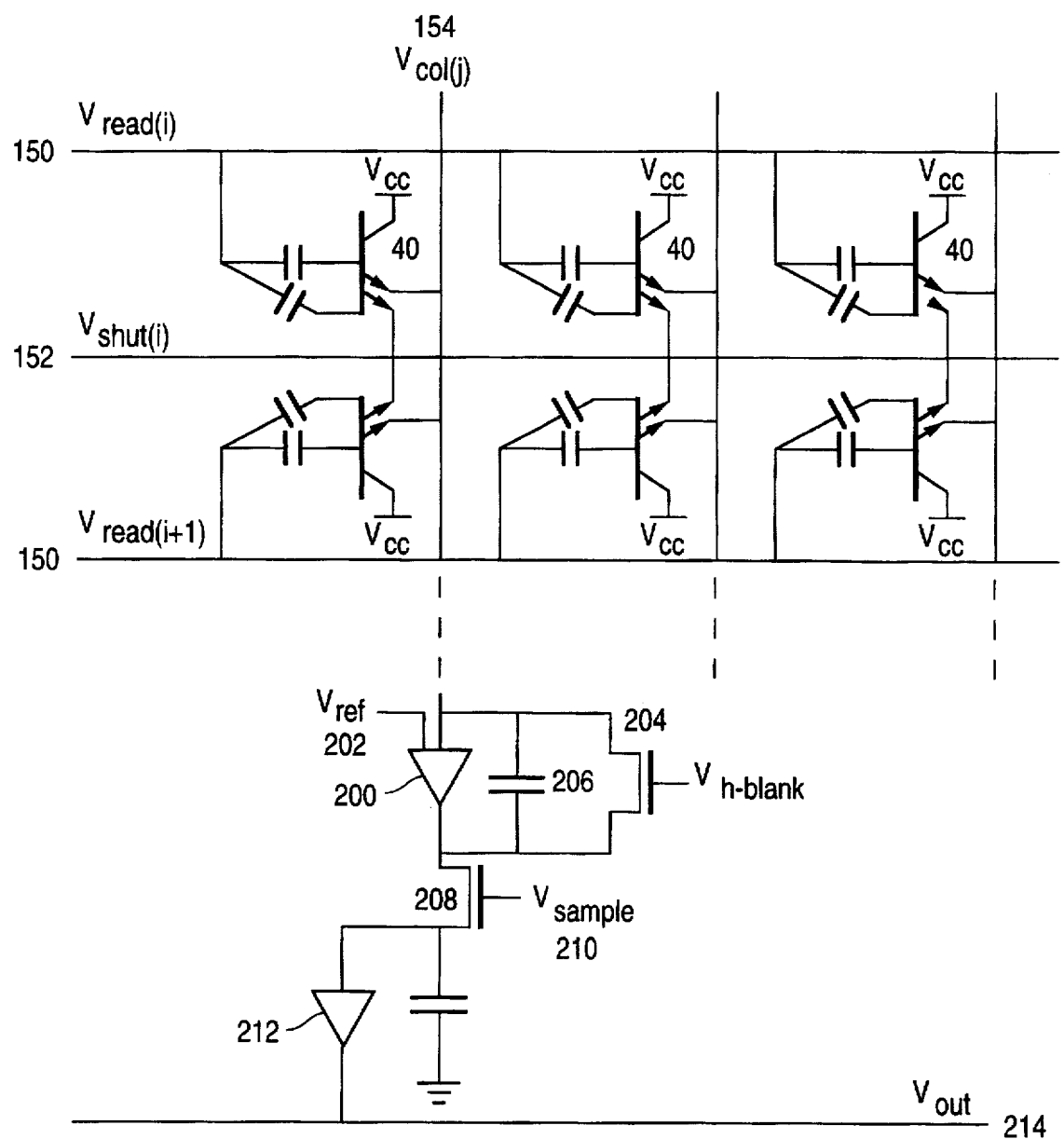
FIG. 7 shows how multiple phototransistors of the present invention may be arranged into an imaging array.

FIG. 7 shows how multiple phototransistors 40 of the present invention may be arranged into an imaging array. FIG. 7 shows a section of the array consisting of two rows (rows i and i+1) and three columns. As shown in the figure, row select line 150 (termed "$V_{read(i)}$") for the ith row is connected to the capacitor which couples the select line to the base of phototransistor 40, and is used to select the row of the imaging array in which the phototransistor to be read (or sensed) is located. A similar row select line is shown for the ith+1 row, and is indicated by the $V_{read(i+1)}$ control line. Shutter control line 152 connects to the second emitter of phototransistor 40 which serves as the shutter for the device. In the figure, shutter control line 152 is shown connected to the shutters for two rows of the array. The emitter junction of phototransistor 40 is connected to column sense line 154, which acts to connect the emitters of each phototransistor in a column of the array. Each column of the array is connected to an image reading circuit of the type described with reference to FIG. 6, and is identified by elements having the same numbers as the corresponding elements of FIG. 6. It is noted FIG. 7 shows the phototransistors having a second capacitor connected between the base and the row select line. This corresponds to the capacitor formed between the base and the row select line during formation of the shutter.

The process flow of the contactless bipolar phototransistor with integrated electronic shutter of the present invention is compatible with standard BiCMOS fabrication processes well known in the art. Three additional masking steps are utilized, one for the base implant, a second for defining the n+ emitter, and a third for defining the shutter region. The n+ emitter and shutter (second emitter) junction can be formed from an n+ implant, or as a result of the diffusion of n+ doped polysilicon.

As will be evident to one skilled in the art, there are many possible variations in the layout and fabrication methods for the combined contactless phototransistor and electronic shutter. The shutter can be formed by an n+ implant with the use of a metal contact, or a Schottky junction can be used as the shutter. The metal shutter control line provides isolation between imaging array elements, since it blocks light between the elements. A shutter line may be shared by two rows of imaging elements, or each row may have its own shutter line to provide high resolution images. Similarly, although the structure and operation of an npn photosensor has been described, the corresponding pnp photosensor with electronic shutter can be implemented by interchanging the references to n+ and p+ regions.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed.

We claim:

1. A method of reducing the overflow and blooming effect associated with the imaging of strong sources by a photosensor, comprising:

forming an integrating photosensor, wherein the photosensor further comprises a collector region of a first conductivity type formed in a substrate of a second conductivity type;

a base region of the second conductivity type formed in the collector region;

a polysilicon region doped to the first conductivity type and disposed over a portion of the base region to form an epitaxial emitter and a sense line node;

a shutter region of the first conductivity type formed in the base region and spaced apart and electrically isolated from the emitter region, the shutter region being electrically connected to a shutter control line node; and a capacitor structure which electrically couples the base region to a select line node;

exposing the photosensor to a source to be imaged;

applying a first voltage to the select line node, the first voltage being selected to reverse bias a base-emitter junction of the photosensor;

integrating photogenerated current on the capacitor;

applying a second voltage to the shutter control line node, the second voltage being selected to reverse bias a base-shutter junction of the photosensor at a lower level than the base-emitter junction;

applying a third voltage to the shutter control line node, wherein the third voltage level is sufficient to forward bias the base-emitter junction of the photosensor; and applying a fourth voltage to the select line node, the fourth voltage being selected to forward bias the base-emitter junction of the photosensor, thereby causing the integrated photocurrent to flow to the sense line node.

2. The method of claim 1, wherein the second voltage level is between approximately 0.1 and 0.5 volts less than the first voltage level.

3. The method of claim 1, wherein the first conductivity type is n-type and the second conductivity type is p-type.

4. The phototransistor of claim 1, wherein the first conductivity type is p-type and the second conductivity type is n-type.

* * * * *

UNITED STATES PATENT AND TRADEMARK OFFICE
CERTIFICATE OF CORRECTION

PATENT NO. : 5,776,795
DATED : July 7, 1998
INVENTOR(S) : Chi, et al.

It is certified that error appears in the above-identified patent and that said Letters Patent is hereby corrected as shown below:

<u>Title page,</u>
Item [54], of the title page,
Please replace "INTERGRATED" with -- INTEGRATED --.

Signed and Sealed this

Sixteenth Day of October, 2001

Attest:

*Attesting Officer*

NICHOLAS P. GODICI
*Acting Director of the United States Patent and Trademark Office*